(12) United States Patent
Lee et al.

(10) Patent No.: US 8,102,704 B2
(45) Date of Patent: Jan. 24, 2012

(54) METHOD OF PREVENTING COUPLING NOISES FOR A NON-VOLATILE SEMICONDUCTOR MEMORY DEVICE

(75) Inventors: Kwang-Jin Lee, Hwaseong-si (KR);
Yong-Jun Lee, Anyang-si (KR);
Du-Eung Kim, Yongin-si (KR);
Woo-Yeong Cho, Suwon-si (KR);
Joon-Yong Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 104 days.

(21) Appl. No.: 12/662,247

(22) Filed: Apr. 7, 2010

(65) Prior Publication Data

US 2010/0302884 A1      Dec. 2, 2010

(30) Foreign Application Priority Data

Jun. 2, 2009   (KR) ........................ 10-2009-0048353

(51) Int. Cl.
*G11C 16/32* (2006.01)
(52) U.S. Cl. ................... 365/185.02; 365/194; 365/206; 365/189.04; 365/233.1
(58) Field of Classification Search ............. 365/185.02, 365/185.09, 185.11, 206, 189.04, 233.1, 365/194
See application file for complete search history.

(56) References Cited

U.S. PATENT DOCUMENTS 6,212,096 B1 *  4/2001  Pascucci .................. 365/185.02
7,826,262 B2 * 11/2010  Wu et al. .................. 365/185.02

FOREIGN PATENT DOCUMENTS

| JP | 11-339487 | 12/1999 |
| KR | 10-2005-0004160 | 1/2005 |
| KR | 10-0673023 | 1/2007 |
| KR | 10-2008-0040425 | 5/2008 |

* cited by examiner

*Primary Examiner* — Andrew Q Tran
(74) *Attorney, Agent, or Firm* — Harness, Dickey & Pierce, P.L.C.

(57) ABSTRACT

Disclosed is a method of preventing coupling noises for a non-volatile semiconductor memory device. According to the method, if an edge of a write operation signal overlaps an activated period of a read operation signal a check result is generated. The write operation signal is modified based on the check result.

20 Claims, 12 Drawing Sheets

METHOD OF PREVENTING COUPLING NOISES FOR A NON-VOLATILE SEMICONDUCTOR MEMORY DEVICE

CROSS-REFERENCE TO RELATED APPLICATIONS

This application claims priority under 35 USC §119 to Korean Patent Application No. 2009-0048353, filed on Jun. 2, 2009, in the Korean Intellectual Property Office (KIPO), the contents of which are incorporated herein in its entirety by reference.

BACKGROUND

1. Field

Example embodiments relate to a non-volatile semiconductor memory device, and more particularly to a method of preventing coupling noises for a non-volatile semiconductor memory device.

2. Description of the Related Art

If a speed of write operations is slower than a speed of read operations in a non-volatile semiconductor memory device, functionality of the non-volatile semiconductor memory device is limited due to a difference between the speed of the write operations and the speed of the read operations. Thus, a non-volatile semiconductor memory device capable of performing read-while-write operations is recently used. The non-volatile semiconductor memory device may perform the read operations while performing the write operations in order to overcome the difference between the speed of the write operations and the speed of the read operations.

The non-volatile semiconductor memory device capable of performing read-while-write operations includes a memory cell array having a plurality of banks, a plurality of read data lines for the read operations, and a plurality of write data lines for the write operations. However, if the non-volatile semiconductor memory device performs the read-while-write operations, a coupling noise may be exist between a read data line transferring the read operation signal and a write data line transferring the write operation signal, if the read data line transferring the read operation signal is adjacent to the write data line transferring the write operation signal.

SUMMARY

Example embodiments provide a method of preventing coupling noises between read data lines and write data lines if a non-volatile semiconductor memory device performs read-while-write operations.

According to example embodiments, a method of preventing coupling noises for a non-volatile semiconductor memory device is provided, the method may check if an edge of a write operation signal is overlapped within an activated period of a read operation signal to generate a check result. The write operation signal may be modified based on the result of the check.

In example embodiments, the activated period of the read operation signal may be from a rising edge of a bit-line discharge signal to a falling edge of a sensing enable signal.

In example embodiments, the activated period of the read operation signal may be from a rising edge of a bit-line precharge signal to a falling edge of a sensing enable signal.

In example embodiments, the edge of the write operation signal may be a rising edge of the write operation signal.

In example embodiments, the write operation signal may be modified by delaying the write operation signal by a first time period if the rising edge of the write operation signal overlaps the activated period of the read operation signal.

In example embodiments, the first time period may shift the rising edge of the write operation signal after an end point of the activated period of the read operation signal.

In example embodiments, the first time period may be from the rising edge of the write operation signal to the end point of the activated period of the read operation signal.

In example embodiments, the write operation signal may be further modified by stretching a delayed write operation signal by a third time period if a falling edge of the delayed write operation signal overlaps a next activated period of the read operation signal.

In example embodiments, the third time period may shift the falling edge of the delayed write operation signal after an end point of the next activated period of the read operation signal.

In example embodiments, the third time period may be from the falling edge of the delayed write operation signal to the end point of the next activated period of the read operation signal.

In example embodiments, the edge of the write operation signal may be a falling edge of the write operation signal.

In example embodiments, the write operation signal may be modified by stretching the write operation signal by a second time period if the falling edge of the write operation signal overlaps the activated period of the read operation signal.

In example embodiments, the second time period may shift the falling edge of the write operation signal after an end point of the activated period of the read operation signal.

In example embodiments, the second time period may be from the falling edge of the write operation signal to the end point of the activated period of the read operation signal.

In example embodiments, the write operation signal may be modified if a read data line transferring the read operation signal is adjacent to a write data line transferring the write operation signal.

In example embodiments, the read data line may be determined to be adjacent to the write data line based on an address of the read data line and as an address of the write data line.

In example embodiments, the read data line may be determined to be adjacent to the write data line when a difference between an address of the read data line and an address of the write data line is lower than a set value.

According to example embodiments, a method of preventing coupling noises for a non-volatile semiconductor memory device is disclosed. The method includes detecting an edge of a write operation signal, detecting a period of a read operation signal, determining if the edge of the write operation signal overlaps the read operation signal, and modifying the write operation signal if the edge of the write operation signal overlaps the read operation signal.

According to example embodiments, using a method of preventing coupling noises for a non-volatile semiconductor memory device, the non-volatile semiconductor memory device may have sufficient sensing margins for read operations because coupling noises caused between read data lines and write data lines are prevented when the non-volatile semiconductor memory device performs read-while-write operations. As a result, the non-volatile semiconductor memory device can achieve high operation reliability and high operation stability.

BRIEF DESCRIPTION OF THE DRAWINGS

Illustrative, non-limiting example embodiments will be more clearly understood from the following detailed description taken in conjunction with the accompanying drawings.

Figure 1:
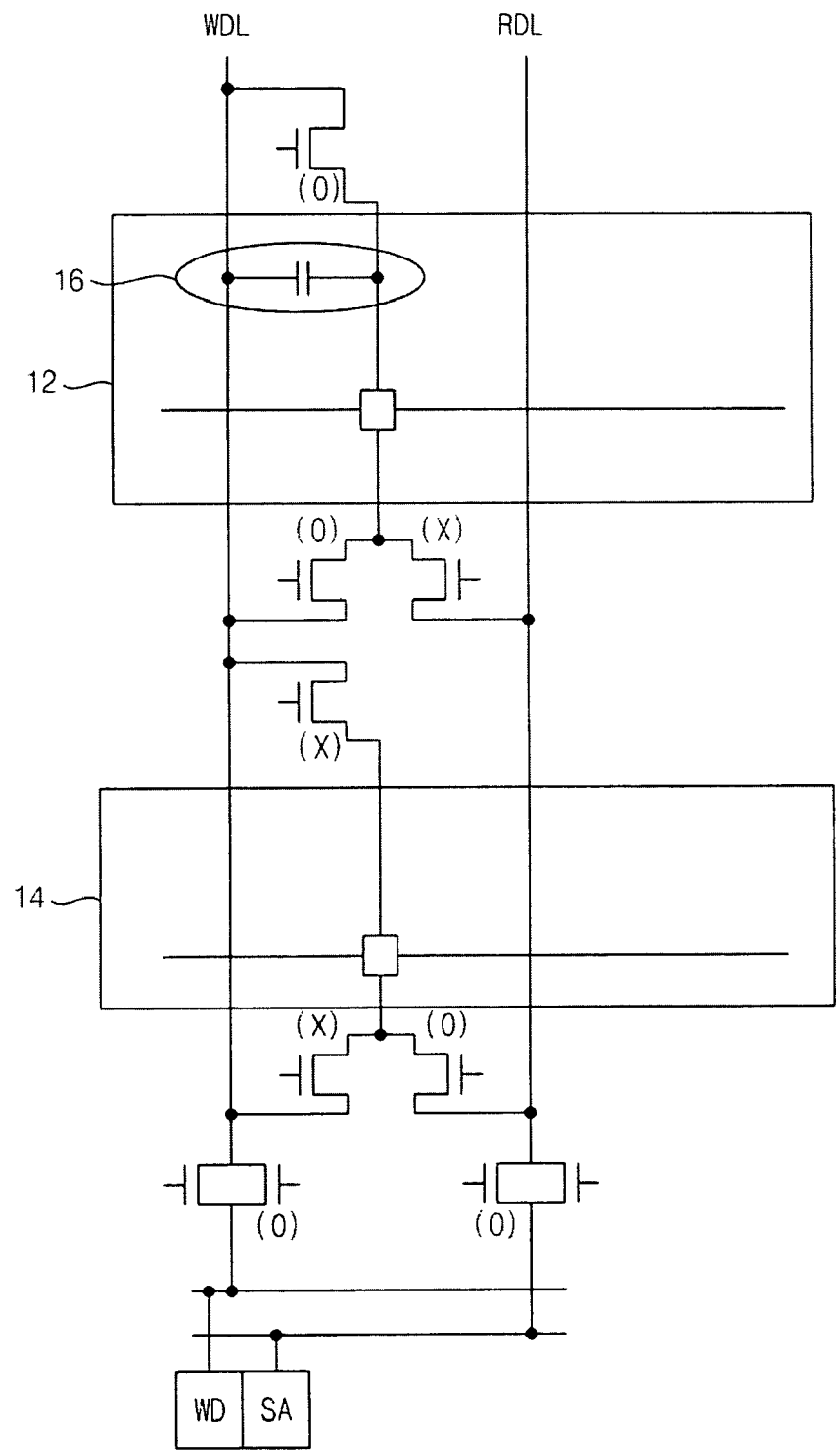
FIG. 1 is a diagram illustrating an example in which a coupling noise is caused between a read data line and a write data line of a non-volatile semiconductor memory device.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EMBODIMENTS

Various example embodiments will be described more fully hereinafter with reference to the accompanying drawings, in which some example embodiments are shown. Example embodiments of the inventive concepts may, however, be embodied in many different forms and should not be construed as limited to the example embodiments set forth herein. Rather, these example embodiments are provided so that this disclosure will be thorough and complete, and will fully convey the scope of example embodiments of the inventive concepts to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of example embodiments of the inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the example embodiments of the inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram illustrating an example case in which a coupling noise is caused between a read data line and a write data line of a non-volatile semiconductor memory device.

Referring to FIG. 1, the non-volatile semiconductor memory device 10 may include a memory cell array having a first and second memory bank 12 and 14, a read data line RDL, and a write data line WDL. The read data line RDL may be coupled to a sense amplifier SA. The write data line WDL may be coupled to a write driver WD. If the non-volatile semiconductor memory device 10 performs a read-while-write operation, the read data line RDL may transfer a read operation signal, and the write data line WDL transfers a write operation signal. For example, a write operation is performed in the first bank 12, and a read operation is performed in the second bank 14. Thus, transistors marked as 'O' may be turned on, and transistors marked as 'X' may be turned off.

As illustrated in FIG. 1, during the read-while-write operation, a coupling noise may exist between the read data line WDL and the write data line RDL due to a coupling capacitance 16. The coupling capacitance 16 may exist if the read data line RDL transferring the read operation signal is adjacent to the write data line WDL transferring the write operation signal during the read-while-write operation. Therefore, the coupling noise between the read data line RDL and the write data line WDL may degrade operation stability and operation reliability of the non-volatile semiconductor memory device 10.

Figure 2:
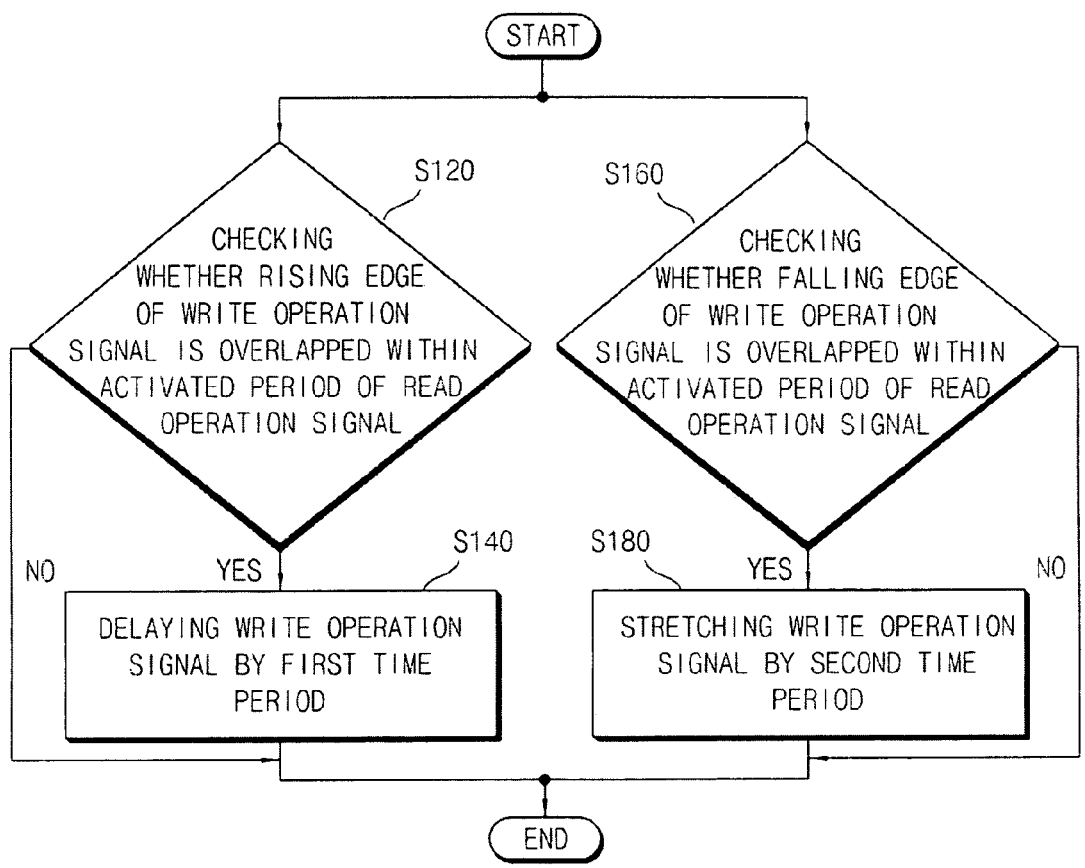
FIG. 2 is a flow chart illustrating a method of preventing or reducing coupling noises for a non-volatile semiconductor memory device according to example embodiments.

FIG. 2 is a flow chart illustrating a method of preventing coupling noises for a non-volatile semiconductor memory device according to example embodiments.

Referring to FIG. 2, the method of preventing or reducing coupling noises for a non-volatile semiconductor memory device may check whether a rising edge of a write operation signal is overlapped within an activated period of a read operation signal (Step S120). The write operation signal may be delayed by a first time period (Step S140) if the rising edge of the write operation signal is overlapped within the activated period of the read operation signal. A falling edge of the write operation signal is overlapped within the activated period of the read operation signal may be checked (Step S160). The write operation signal may be stretched, e.g., modified to be a longer period of time, by a second time period (Step S180) if the falling edge of the write operation signal is overlapped within the activated period of the read operation signal.

The coupling noises may be prevented by checking if an edge (i.e., the rising edge or the falling edge) of the write operation signal is overlapped within the activated period of the read operation signal to generate a check result, and by modifying the write operation signal based on the check result. The write operation signal may be delayed by the first time period if the rising edge of the write operation signal is overlapped within the activated period of the read operation signal. The write operation signal may be stretched, e.g., modified to be a longer period of time, by the second time period if the falling edge of the write operation signal is overlapped within the activated period of the read operation signal. In example embodiments, the activated period of the read operation signal may be set to be from a rising edge of a bit-line discharge signal to a falling edge of a sensing enable signal. In example embodiments, the activated period of the read operation signal may be set to be from a rising edge of a bit-line precharge signal to the falling edge of the sensing enable signal.

The write operation signal may be delayed by the first time period if the rising edge of the write operation signal is overlapped within the activated period of the read operation signal, so that the rising edge of the write operation signal may be outside the activated period of the read operation signal. The write operation signal may be stretched, e.g., modified to be a longer period of time, by the second time period if the falling edge of the write operation signal is overlapped within the activated period of the read operation signal, so that the falling edge of the write operation signal may be outside the activated period of the read operation signal.

The first time period may be set (e.g., 50 nano-second (ns)) such that the rising edge of the write operation signal is outside the activated period of the read operation signal. In example embodiments, the first time period may be set such that the rising edge of the write operation signal after an end point of the activated period of the read operation signal. For example, the first time period may be set to be from the rising edge of the write operation signal to the end point of the activated period of the read operation signal.

The second time period may be set to place the falling edge of the write operation signal outside the activated period of the read operation signal. In example embodiments, the second time period may be such that the falling edge of the write operation signal after the end point of the activated period of the read operation signal. For example, the second time period may be set to be from the falling edge of the write operation signal to the end point of the activated period of the read operation signal.

As described above, the write operation signal may be modified (e.g., delayed or stretched) such that the rising edge and the falling edge of the write operation signal may be outside the activated period of the read operation signal. Thus, the coupling noises between read data lines and write data lines may be prevented if the non-volatile semiconductor memory device performs read-while-write operations. Although Step S120 and Step S140 may be performed in parallel with Step S160 and Step S180 in FIG. 2, Step S120, Step S140, Step S160, and Step S180 may be performed in series.

Figure 3:
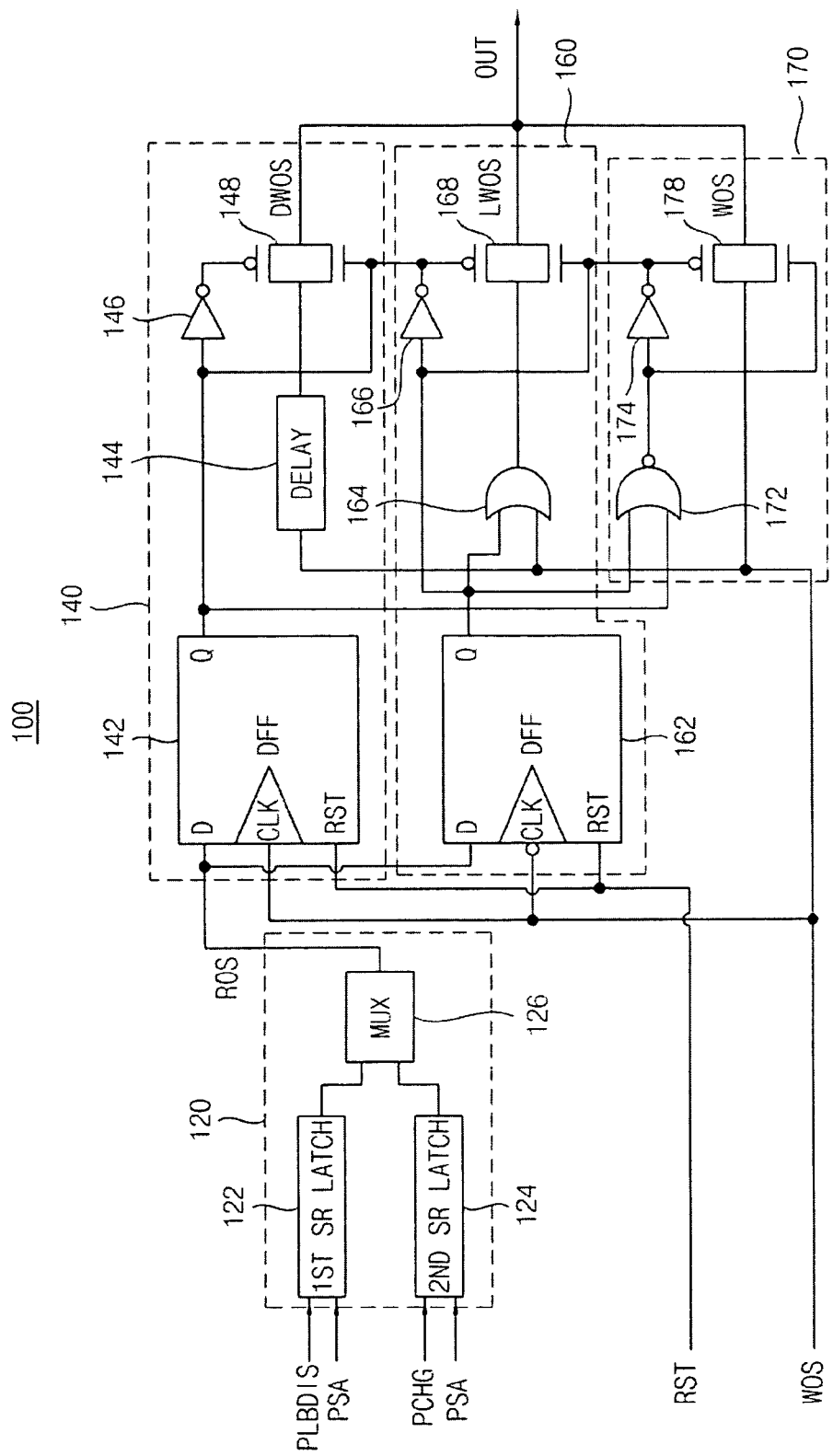
FIG. 3 is a block diagram illustrating a coupling noise prevention device that performs the method of FIG. 2.

FIG. 3 is a block diagram illustrating a coupling noise prevention device that performs a method of FIG. 2. Referring to FIG. 3, the coupling noise prevention device 100 may include a check unit 120, a delay unit 140, a stretch unit 160, and a pass unit 170.

The check unit 120 may receive the bit-line discharge signal PLBDIS, the bit-line precharge signal PCHG, and the sensing enable signal PSA. The check unit 120 may set the activated period of the read operation signal ROS to be from the rising edge of the bit-line discharge signal PLBDIS to the falling edge of the sensing enable signal PSA, or to be from the rising edge of the bit-line precharge signal PCHG to the falling edge of the sensing enable signal PSA. The check unit 120 may output the read operation signal ROS to the delay unit 140 and the stretch unit 160.

For example, the check unit 120 may include a first latch 122, a second latch 124, and a multiplexer 126. Each of the first latch 122 and the second latch 124 may be a SR latch. The first latch 122 may receive the bit-line discharge signal PLBDIS and the sensing enable signal PSA, and may set the activated period of the read operation signal ROS to be from the rising edge of the bit-line discharge signal PLBDIS to the falling edge of the sensing enable signal PSA.

The second latch 124 may receive the bit-line precharge signal PCHG and the sensing enable signal PSA, and may set the activated period of the read operation signal ROS to be from the rising edge of the bit-line precharge signal PCHG to the falling edge of the sensing enable signal PSA. The multiplexer 126 may select one of an output of the first latch 122 and an output of the second latch 124, and may output the selected one as the read operation signal ROS.

Although, as shown in FIG. 3, the check unit 120 is implemented with a multiple structure in the check unit 120 may be implemented with a single structure. For example, the check unit 120 may include one latch. In example embodiments, the check unit 120 may receive the bit-line discharge signal PLBDIS and the sensing enable signal PSA. The check unit 120 may set the activated period of the read operation signal ROS to be from the rising edge of the bit-line discharge signal PLBDIS to the falling edge of the sensing enable signal PSA, and may output the read operation signal ROS to the delay unit 140 and the stretch unit 160.

In example embodiments, the check unit 120 may receive the bit-line precharge signal PCHG and the sensing enable signal PSA. The check unit 120 may set the activated period of the read operation signal ROS to be from the rising edge of the bit-line precharge signal PCHG to the falling edge of the sensing enable signal PSA, and may output the read operation signal ROS to the delay unit 140 and the stretch unit 160.

The delay unit 140 may receive the read operation signal ROS and the write operation signal WOS. The delay unit 140 may check if the rising edge of the write operation signal WOS is overlapped within the activated period of the read operation signal ROS, and delay the write operation signal WOS by the first time period if the rising edge of the write operation signal WOS is overlapped within the activated period of the read operation signal ROS.

For example, the delay unit 140 may delay the write operation signal WOS by the first time period to generate a delayed write operation signal DWOS, and may output the delayed write operation signal DWOS as an output signal OUT. For example, the delay unit 140 may include a first flip-flop 142, a delay element 144, a first inverter 146, and a first switch 148. The first flip-flop 142 may receive the read operation signal ROS and the write operation signal WOS. The first flip-flop 142 may output logical value '1' if the rising edge of the write operation signal WOS is overlapped within the activated period of the read operation signal ROS, and the first flip-flop 142 may output logical value '0' if the rising edge of the write operation signal WOS is not overlapped within the activated period of the read operation signal ROS. The first inverter 146 may invert logical value '1' output from the first flip-flop 142 to turn on the first switch 148 if the first flip-flop 142 outputs logical value '1'. Therefore, the write operation signal WOS may be delayed by the first time period by the delay element 144, such that the delayed write operation signal DWOS may be output as the output signal OUT.

The stretch unit 160 may receive the read operation signal ROS and the write operation signal WOS. The stretch unit 160 may check if the falling edge of the write operation signal WOS is overlapped within the activated period of the read operation signal ROS, and stretch the write operation signal WOS by the second time period if the falling edge of the write operation signal WOS is overlapped within the activated period of the read operation signal ROS.

For example, the stretch unit 160 may stretch the write operation signal WOS by the second time period to generate a stretched, e.g., modified to be a longer period of time, write operation signal LWOS, and output the stretched write operation signal LWOS as the output signal OUT. For example, the stretch unit 160 may include a second flip-flop 162, an OR element 164, a second inverter 166, and a second switch 168.

The second flip-flop 162 may receive the read operation signal ROS and the write operation signal WOS. The second flip-flop 162 may output logical value '1' if the falling edge of the write operation signal WOS is overlapped within the activated period of the read operation signal ROS, and may output logical value '0' if the falling edge of the write operation signal WOS is not overlapped within the activated period of the read operation signal ROS.

The second inverter 166 may invert logical value '1' output from the second flip-flop 162 to turn on the second switch 168 when the second flip-flop 162 outputs logical value '1'. Thus, the OR element 164 may output logical value '1' if the falling edge of the write operation signal WOS is overlapped within the activated period of the read operation signal ROS. Therefore, the write operation signal WOS may be stretched, e.g., modified to be a longer period of time, by the second time period, such that the stretched write operation signal LWOS may be output as the output signal OUT.

The pass unit 170 may output the write operation signal WOS as the output signal OUT if the rising edge and the falling edge of the write operation signal WOS are not overlapped within the activated period of the read operation signal ROS. For example, the pass unit 170 may include a XOR element 172, a third inverter 174, and a third switch 178.

The first flip-flop 142 and the second flip-flop 162 may output logical value '0' if the rising edge and the falling edge of the write operation signal WOS are not overlapped within the activated period of the read operation signal ROS. Thus, the XOR element 172 may output logical value '1' if the rising edge and the falling edge of the write operation signal WOS are not overlapped within the activated period of the read operation signal ROS.

The third inverter 174 may invert logical value '1' output from the XOR element 172 to turn on the third switch 178 if the XOR element outputs logical value '1'. Therefore, the write operation signal WOS is passed, such that the write operation signal WOS may be output as the output signal OUT.

As described above, the write operation signal WOS may be modified (e.g., delayed or stretched) to place the rising edge and the falling edge of the write operation signal WOS outside the activated period of the read operation signal ROS. For example, the coupling noise prevention device 100 may output one of the write operation signal WOS, the delayed write operation signal DWOS, and the stretched, e.g., modified to be a longer period of time, write operation signal LWOS as the output signal OUT. Thus, the coupling noises between read data lines and write data lines may be prevented or reduced if the non-volatile semiconductor memory device performs read-while-write operations.

Figure 4:
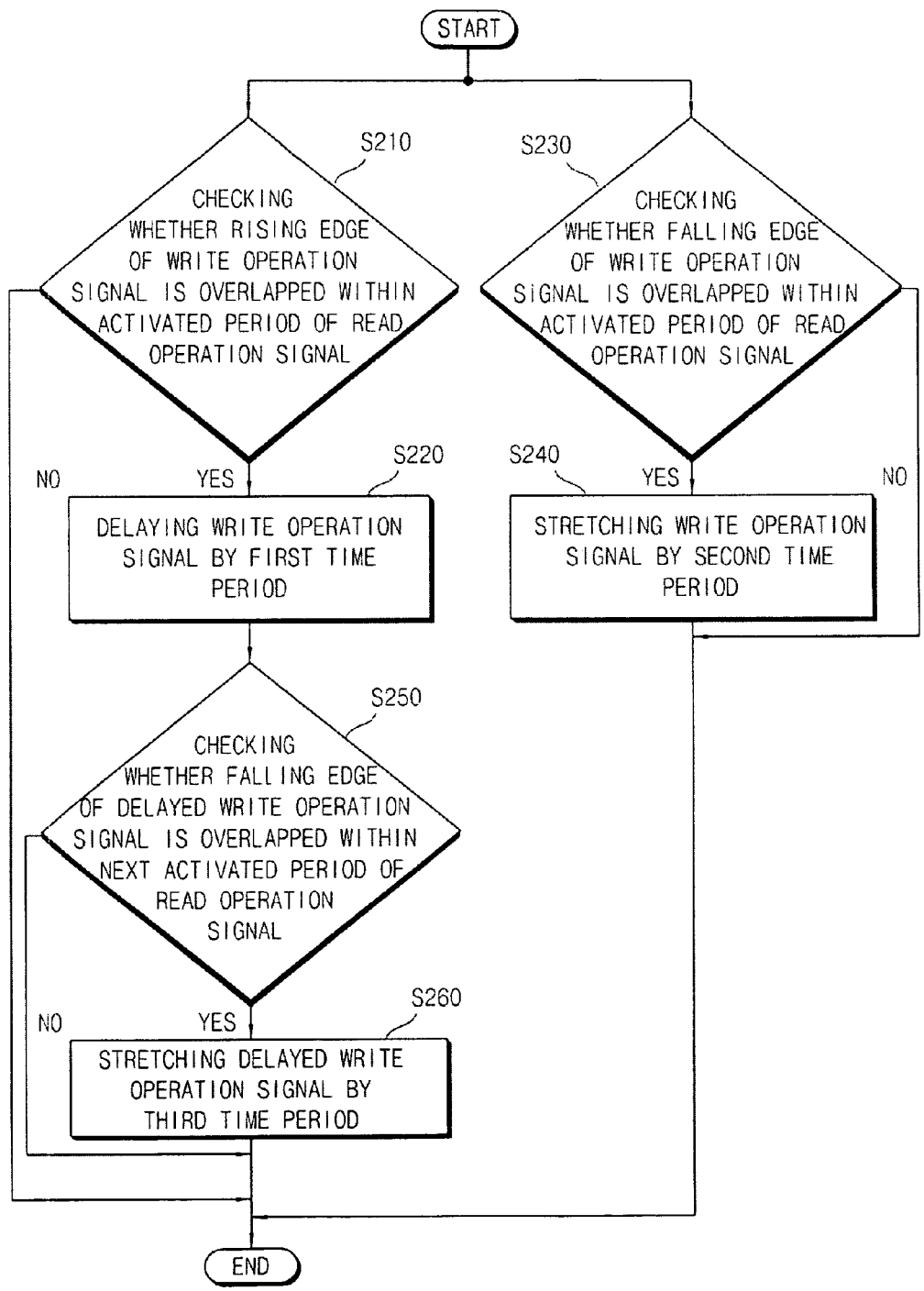
FIG. 4 is a flow chart illustrating a method of preventing or reducing coupling noises for a non-volatile semiconductor memory device according to example embodiments.

FIG. 4 is a flow chart illustrating a method of preventing or reducing coupling noises for a non-volatile semiconductor memory device according to a second example embodiment.

Referring to FIG. 4, the method of preventing or reducing coupling noises for a non-volatile semiconductor memory device may be check if a rising edge of a write operation signal is overlapped within an activated period of a read operation signal (Step S210). The write operation signal may be delayed by a first time period (Step S220) if the rising edge of the write operation signal is overlapped within the activated period of the read operation signal. A falling edge of the write operation signal is overlapped within the activated period of the read operation signal may be checked (Step S230). The write operation signal may be stretched, e.g., modified to be a longer period of time, by a second time period (Step S240) if the falling edge of the write operation signal is overlapped within the activated period of the read operation signal. In addition, a falling edge of a delayed write operation signal is overlapped within a next activated period of the read operation signal may be checked (Step S250). The delayed write operation signal may be stretched, e.g., modified to be a longer period of time, by a third time period (Step S260) if the falling edge of the delayed write operation signal is overlapped within the next activated period of the read operation signal.

The coupling noises may be prevented or reduced by checking if an edge (e.g., the rising edge or the falling edge) of the write operation signal is overlapped within the activated period of the read operation signal to generate a check result, and by modifying the write operation signal based on the check result. For example, the write operation signal may be delayed by the first time period when the rising edge of the write operation signal is overlapped within the activated period of the read operation signal, such that the rising edge of the write operation signal may be outside the activated period of the read operation signal.

The write operation signal may be stretched, e.g., modified to be a longer period of time, by the second time period if the falling edge of the write operation signal is overlapped within the activated period of the read operation signal, such that the falling edge of the write operation signal may be outside the activated period of the read operation signal. The delayed write operation signal may be stretched, e.g., modified to be a longer period of time, by the third time period if the falling edge of the delayed write operation signal is overlapped within the next activated period of the read operation signal, such that the falling edge of the delayed write operation signal may be placed outside the next activated period of the read operation signal.

The non-volatile semiconductor memory device may receive an asynchronous read operation signal. The falling edge of the delayed write operation signal may be overlapped within the next activated period of the asynchronous read operation signal after the write operation signal is delayed by the first time period. Therefore, coupling noises may exist between read data lines and write data lines because the falling edge of the delayed write operation signal is overlapped within the next activated period of the asynchronous read operation signal.

Thus, in the method of preventing coupling noises in a non-volatile semiconductor memory device, the delayed write operation signal may be stretched, e.g., modified to be a longer period of time, by the third time period if the falling edge of the delayed write operation signal is overlapped within the next activated period of the asynchronous read operation signal. The third time period may be set the falling edge of the delayed write operation signal outside the next activated period of the read operation signal. In example embodiments, the third time period may set the falling edge of the delayed write operation signal after an end point of the next activated period of the read operation signal. For example, the third time period may be set to be from the falling edge of the delayed write operation signal to the end point of the next activated period of the read operation signal.

As described above, the write operation signal may be modified (e.g., delayed or stretched) to place the rising edge and the falling edge of the write operation signal outside the activated period of the read operation signal. In addition, the delayed write operation signal may be modified (e.g., stretched) such that the falling edge of the delayed write operation signal outside the next activated period of the read operation signal. Thus, the coupling noises between read data lines and write data lines may be prevented or reduced if the non-volatile semiconductor memory device performs read-while-write operations. As shown in FIG. 4, Step S210, Step S220, Step S250, and Step S260 are performed in parallel with Step S230 and Step S240. However, example embodiments are not limited thereto, and Step S210, Step S220, Step S230, Step S240, Step S250, and Step S260 may be performed in series.

Figure 5:
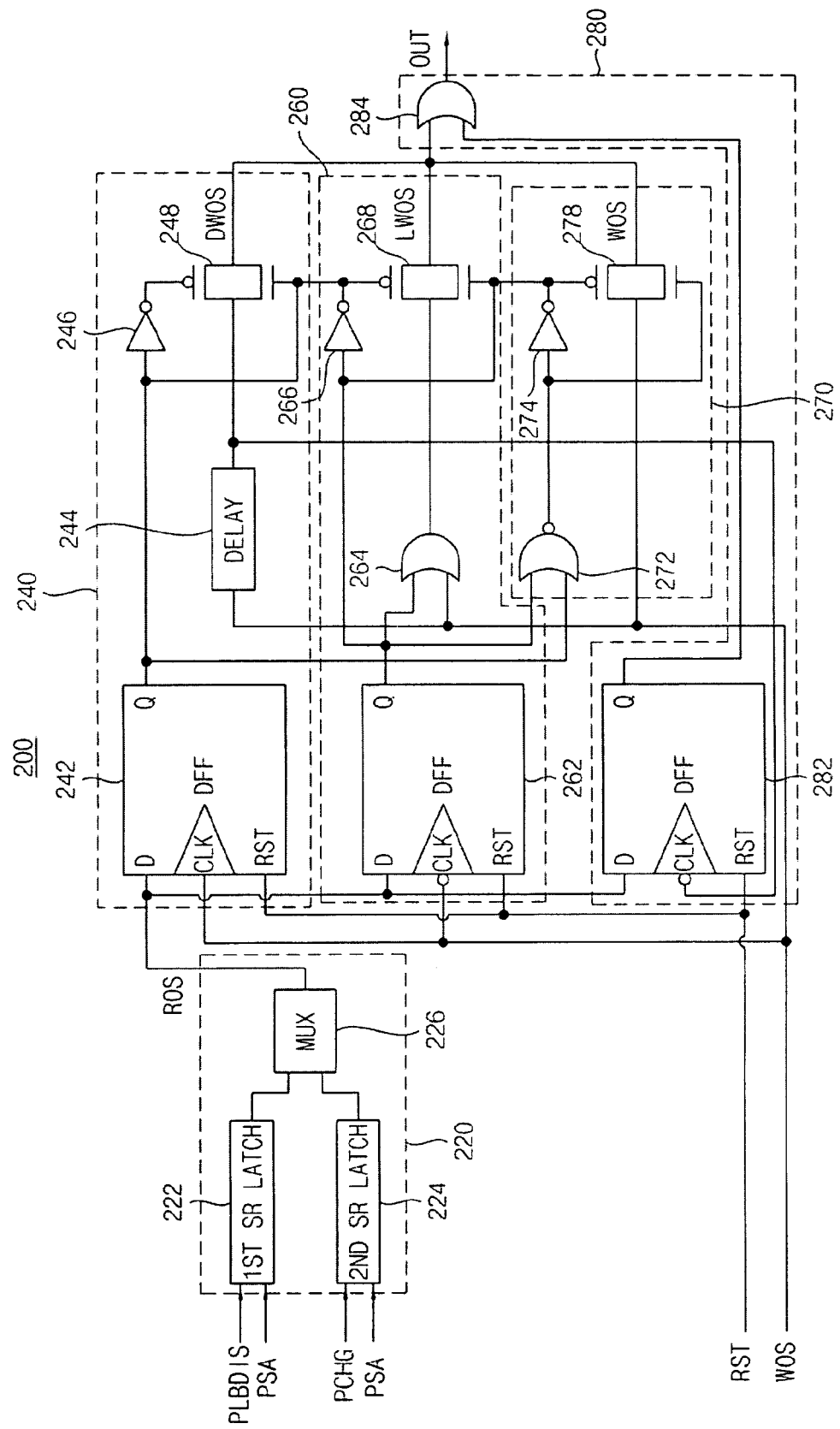
FIG. 5 is a block diagram illustrating a coupling noise prevention device that performs the method of FIG. 4.

FIG. 5 is a block diagram illustrating a coupling noise prevention or reduction device to perform the method of FIG. 4.

Referring to FIG. 5, the coupling noise prevention or reduction device 200 may include a check unit 220, a delay unit 240, a first stretch unit 260, a pass unit 270, and a second stretch unit 280. The description of the check unit 220, the delay unit 240, the first stretch unit 260, and the pass unit 270 and their respective subcomponents will be omitted because operations of the check unit 220, the delay unit 240, the first stretch unit 260, and the pass unit 270 are the same as check unit 120, the delay unit 140, the first stretch unit 160, and the pass unit 170 which are described above with regard to FIG. 3. Hereinafter, the second stretch unit 280 will be described in detail.

The second stretch unit 280 may receive the read operation signal ROS and the delayed write operation signal DWOS. The second stretch unit 280 may check if the falling edge of the delayed write operation signal DWOS is overlapped within the next activated period of the read operation signal ROS. The second stretch unit 280 may stretch the delayed write operation signal DWOS by the third time period if the falling edge of the delayed write operation signal DWOS is overlapped within the next activated period of the read operation signal ROS, and output the delayed-stretched write operation signal as an output signal OUT. For example, the second stretch unit 280 may include a third flip-flop 282 and a second OR element 284.

The third flip-flop 282 may receive the delayed write operation signal DWOS from a delay element 244 of the delay unit 240, and the read operation signal ROS from a multiplexer 226 of the check unit 220. The third flip-flop 282 may check if the falling edge of the delayed write operation signal DWOS is overlapped within the next activated period of the read operation signal ROS. The third flip-flop 282 may output logical value '1' if the falling edge of the delayed write operation signal DWOS is overlapped within the next activated period of the read operation signal ROS, and may output logical value '0' if the falling edge of the delayed write operation signal DWOS is not overlapped within the next activated period of the read operation signal ROS. The second OR element 284 may stretch the delayed write operation signal DWOS by the third time period if the third flip-flop 282 outputs logical value '1', and may output the delayed-stretched write operation signal as the output signal OUT.

As described above, the write operation signal WOS may be modified (e.g., delayed or stretched) to place the rising edge and the falling edge of the write operation signal WOS outside the activated period of the read operation signal ROS. In addition, the delayed write operation signal DWOS may be modified (e.g., stretched) to place the falling edge of the delayed write operation signal DWOS outside the next activated period of the read operation signal ROS. For example, the coupling noise prevention or reduction device 200 may output one of the write operation signal WOS, the delayed write operation signal DWOS, the stretched, e.g., modified to be a longer period of time, write operation signal LWOS, and the delayed-stretched write operation signal as the output signal OUT. Thus, the coupling noises between read data lines and write data lines may be prevented or reduced if the non-volatile semiconductor memory device performs read-while-write operations.

Figure 6:
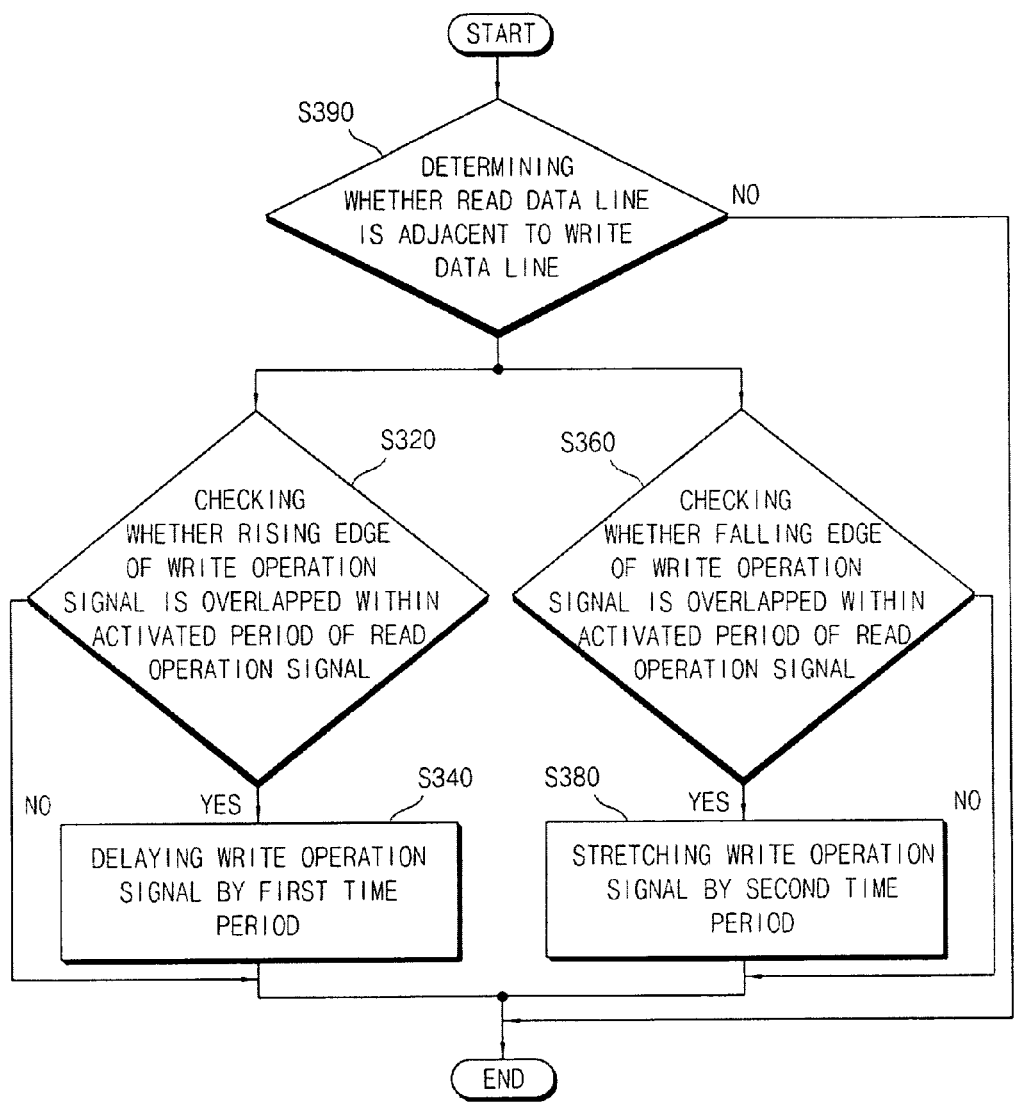
FIG. 6 is a flow chart illustrating a method of preventing or reducing coupling noises for a non-volatile semiconductor memory device according to example embodiments.

FIG. 6 is a flow chart illustrating a method of preventing or reducing coupling noises for a non-volatile semiconductor memory device according to example embodiments.

Referring to FIG. 6, the method of preventing or reducing coupling noises for a non-volatile semiconductor memory device may check whether a rising edge of a write operation signal is overlapped within an activated period of a read operation signal (Step S320). The write operation signal may be delayed by a first time period (Step S340) if the rising edge of the write operation signal is overlapped within the activated period of the read operation signal. A falling edge of the write operation signal is overlapped within the activated period of the read operation signal may be checked (Step S360). The write operation signal may be stretched, e.g., modified to be a longer period of time, by a second time period (Step S380) if the falling edge of the write operation signal is overlapped within the activated period of the read operation signal. In addition, the write operation signal may be modified if a read data line transferring the read operation signal is adjacent to a write data line transferring the write operation signal (Step S390).

The coupling noises may be prevented or reduced by checking if an edge (e.g., the rising edge or the falling edge) of the write operation signal is overlapped within the activated period of the read operation signal to generate a check result, and by modifying the write operation signal based on the check result. For example, the write operation signal may be delayed by the first time period when the rising edge of the write operation signal is overlapped within the activated period of the read operation signal, such that the rising edge of the write operation signal may be outside the activated period of the read operation signal. The write operation signal may be stretched, e.g., modified to be a longer period of time, by the second time period if the falling edge of the write operation signal is overlapped within the activated period of the read operation signal, such that the falling edge of the write operation signal may be outside the activated period of the read operation signal. The write operation signal may be modified (e.g., delayed or stretched) if the read data line transferring the read operation signal is adjacent to the write data line transferring the write operation signal. In example embodiments the read line may be determined to be adjacent to the write data line if an address of the read data line transferring the read operation signal is substantially the same as an address of the write data line transferring the write operation signal. In example embodiments the read data line may be determined to be adjacent to the write data line when a difference between the address of the read data line transferring the read operation signal and the address of the write data line transferring the write operation signal is lower than a set value.

As described above, the write operation signal may be modified (e.g., delayed or stretched) such that the rising edge and the falling edge of the write operation signal outside the activated period of the read operation signal. The write operation signal may be modified (e.g., delayed or stretched) if the read data line transferring the read operation signal is adjacent to the write data line transferring the write operation signal. Thus, the coupling noises between read data lines and write data lines may be prevented or reduced if the non-volatile semiconductor memory device performs read-while-write operations. As shown in FIG. 6, Step S320 and Step S340 are performed in parallel with Step S360 and Step S380. However, example embodiments are not limited thereto and Step S320, Step S340, Step S360, and Step S380 may be performed in series.

Figure 7:
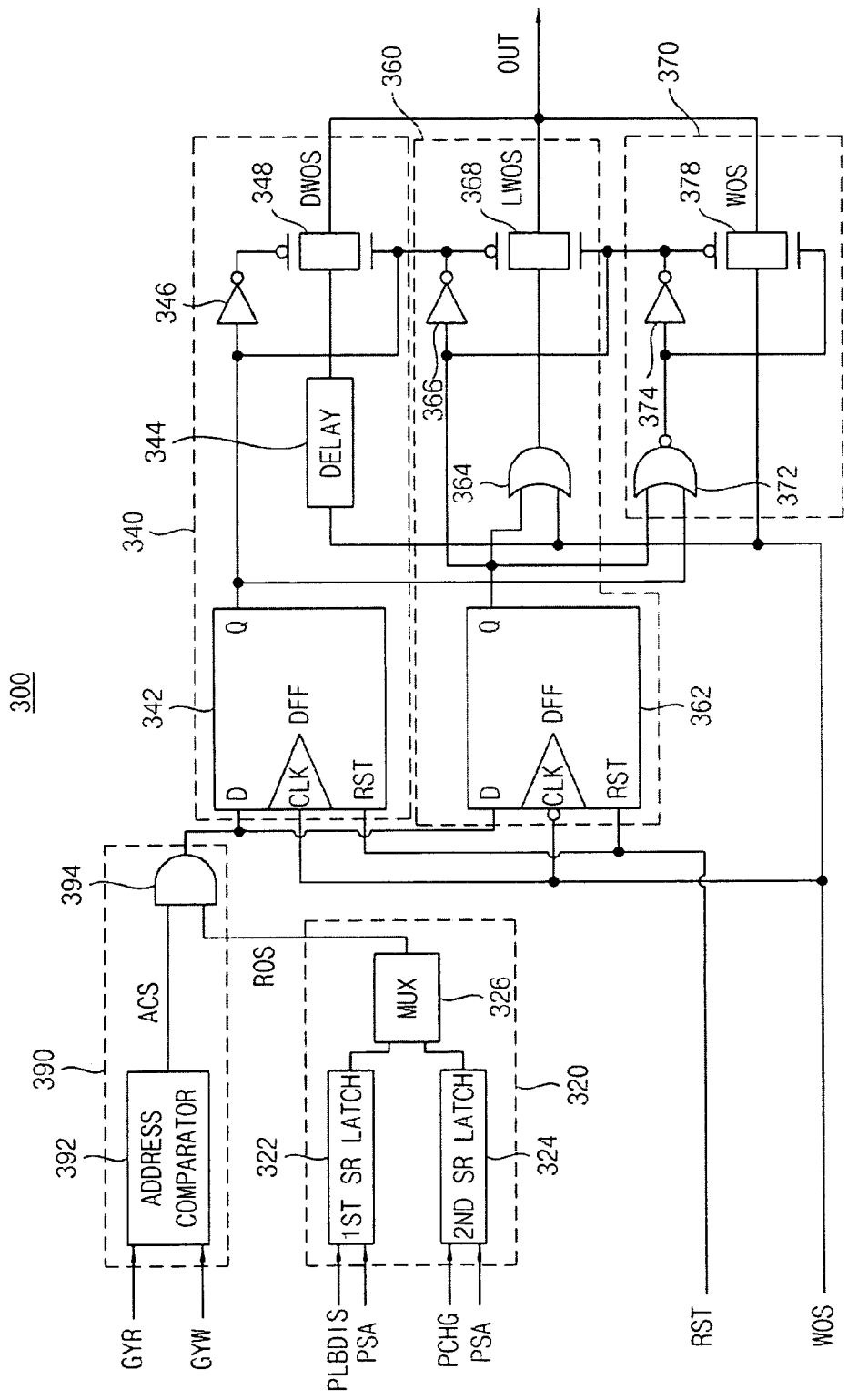
FIG. 7 is a block diagram illustrating a coupling noise prevention device that performs the method of FIG. 6.

FIG. 7 is a block diagram illustrating a coupling noise prevention device 300 that performs the method of FIG. 6.

Referring to FIG. 7, the coupling noise prevention device 300 may include a check unit 320, a delay unit 340, a stretch unit 360, a pass unit 370, and a control unit 390. The description of the check unit 320, the delay unit 340, the stretch unit 360, and the pass unit 370 and their respective subcomponents will be omitted because operations of the check unit 320, the delay unit 340, the stretch unit 360, and the pass unit 370 are the same as the check unit 120, the delay unit 140, the stretch unit 160, and the pass unit 170 which are described above with regard to FIG. 3. Hereinafter, the control unit 390 will be described in detail.

The control unit 390 may receive a read address signal GYR and a write address signal GYW. The control unit 390 may compare the read address signal GYR with the write address signal GYW to generate an address comparison signal ACS, and controls the delay unit 340 and the stretch unit 360 based on the address comparison signal ACS. The read address signal GYR may correspond to the address of the read data line transferring the read operation signal. The write address signal GYW may correspond to the address of the write data line transferring the write operation signal. In example embodiments, the delay unit 340 and the stretch unit 360 may operate if the read address signal GYR is substantially the same as the write address signal GYW. In example embodiments, the delay unit 340 and the stretch unit 360 may operate if the difference between the read address signal GYR and the write address signal GYW is lower than a set value.

For example, the control unit 390 may include an address comparator 392 and an AND element 394. The control unit 390 may receive the read address signal GYR and the write address signal GYW. The control unit 390 compares the read address signal GYR with the write address signal GYW to generate the address comparison signal ACS. In example embodiments, the address comparison signal ACS may have logical value '1' if the read address signal GYR is substantially the same as the write address signal GYW. The address comparison signal ACS may have logical value '0' if the read address signal GYR is different from the write address signal GYW. In another example embodiment, the address comparison signal ACS may have logical value '1' when the difference between the read address signal GYR and the write address signal GYW is lower than the set value. The address comparison signal ACS may have logical value '0' when the difference between the read address signal GYR and the write address signal GYW is higher than the set value. Therefore, the AND element 394 may output logical value '1' to the first flip-flop 342 and the second flip-flop 362 when the address comparison signal ACS has logical value '1', and the read operation signal ROS has logical value '1' (e.g., the activated period of the read operation signal ROS). On the other hand, the AND element 394 may output logical value '0' to the first flip-flop 342 and the second flip-flop 362 if the address comparison signal ACS has logical value '0', or the read operation signal ROS has logical value '0' (e.g., the deactivated period of the read operation signal ROS).

As described above, the write operation signal WOS may be modified (e.g., delayed or stretched) such that the rising edge and the falling edge of the write operation signal WOS outside the activated period of the read operation signal ROS. For example, the coupling noise prevention device 300 may output one of the write operation signal WOS, the delayed write operation signal DWOS, and the stretched, e.g., modified to be a longer period of time, write operation signal LWOS as an output signal OUT. Thus, the coupling noises between read data lines and write data lines may be prevented or reduced if the non-volatile semiconductor memory device performs read-while-write operations.

Figure 8:
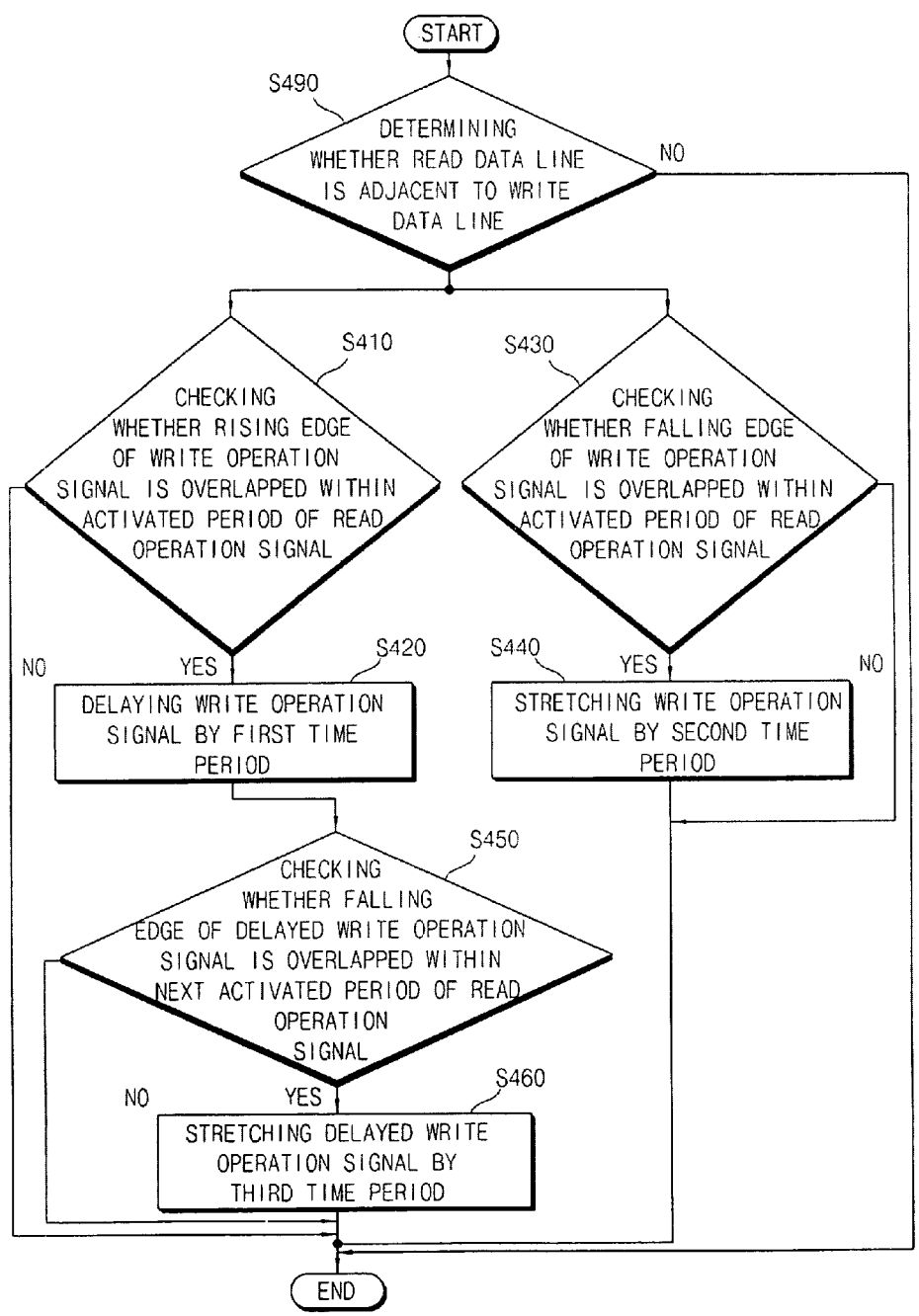
FIG. 8 is a flow chart illustrating a method of preventing or reducing coupling noises for a non-volatile semiconductor memory device according to example embodiments.

FIG. 8 is a flow chart illustrating a method of preventing or reducing coupling noises for a non-volatile semiconductor memory device according to example embodiments.

Referring to FIG. 8, the method of preventing or reducing coupling noises for a non-volatile semiconductor memory device may be check if a rising edge of a write operation signal is overlapped within an activated period of a read operation signal (Step S410). The write operation signal may be delayed by a first time period (Step S420) if the rising edge of the write operation signal is overlapped within the activated period of the read operation signal. If a falling edge of the write operation signal is overlapped within the activated period of the read operation signal may be checked (Step S430). The write operation signal may be stretched, e.g., modified to be a longer period of time, by a second time period (Step S440) if the falling edge of the write operation signal is overlapped within the activated period of the read operation signal. In addition, if a falling edge of a delayed write operation signal is overlapped within a next activated period of the read operation signal may be checked (Step S450). The delayed write operation signal may be stretched, e.g., modified to be a longer period of time, by a third time period (Step S460) if the falling edge of the delayed write operation signal is overlapped within the next activated period of the read operation signal. The write operation signal (and the delayed write operation signal) may be modified if a read data line transferring the read operation signal is adjacent to a write data line transferring the write operation signal (Step S490).

The coupling noises may be prevented or reduced by checking if an edge (i.e., the rising edge or the falling edge) of the write operation signal is overlapped within the activated period of the read operation signal to generate a check result, and by modifying the write operation signal based on the check result. For example, the write operation signal may be delayed by the first time period when the rising edge of the write operation signal is overlapped within the activated period of the read operation signal, such that the rising edge of the write operation signal may be placed outside the activated period of the read operation signal.

The write operation signal may be stretched, e.g., modified to be a longer period of time, by the second time period when the falling edge of the write operation signal is overlapped within the activated period of the read operation signal, such that the falling edge of the write operation signal may be outside the activated period of the read operation signal. In addition, the delayed write operation signal may be stretched, e.g., modified to be a longer period of time, by the third time period if the falling edge of the delayed write operation signal is overlapped within the next activated period of the read operation signal, such that the falling edge of the delayed write operation signal may be outside the next activated period of the read operation signal.

Further, the write operation signal (and the delayed write operation signal) may be modified if the read data line transferring the read operation signal is adjacent to the write data line transferring the write operation signal. In example embodiments the read data line may be determined to be adjacent to the write data line if an address of the read data line transferring the read operation signal is substantially the same as an address of the write data line transferring the write operation signal.

In example embodiments, the read data line may be determined to be adjacent to the write data line if a difference between the address of the read data line transferring the read operation signal and the address of the write data line transferring the write operation signal is lower than a set value.

As described above, the write operation signal may modified (e.g., delayed or stretched) such that the rising edge and the falling edge of the write operation signal is outside the activated period of the read operation signal. In addition, the delayed write operation signal may be modified (e.g., stretched) to place the falling edge of the delayed write operation signal outside the next activated period of the read operation signal. Here, the write operation signal (and the delayed write operation signal) may be modified if the read data line transferring the read operation signal is adjacent to the write data line transferring the write operation signal. Thus, the coupling noises between read data lines and write data lines may be prevented or reduced if the non-volatile semiconductor memory device performs read-while-write operations. As shown in FIG. 8, Step S410, Step S420, Step S450, and Step S460 are performed in parallel with Step S430 and Step S440. However, example embodiments are not limited thereto and Step S410, Step S420, Step S430, Step S440, Step S450, and Step S460 may be performed in series.

Figure 9:
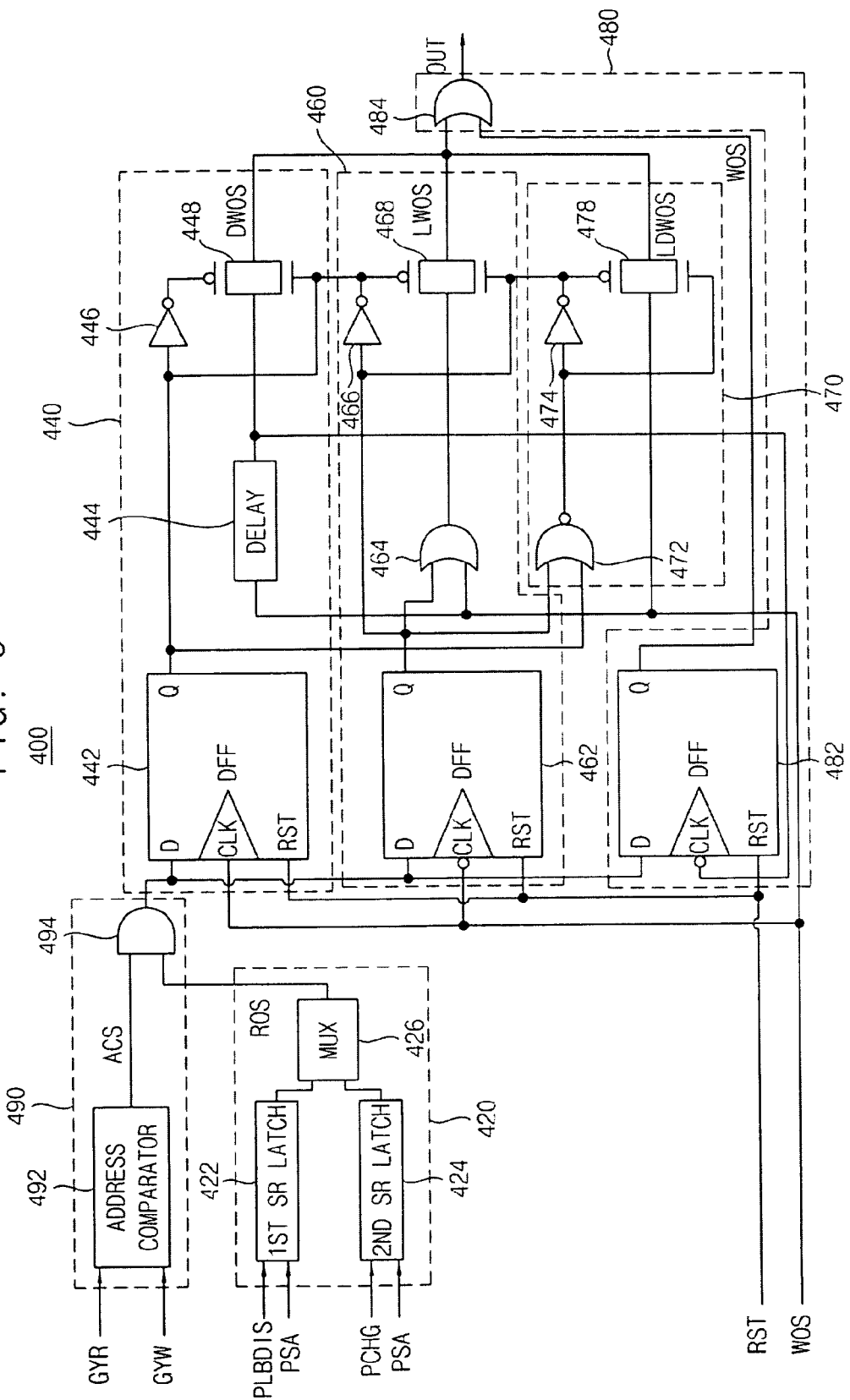
FIG. 9 is a block diagram illustrating a coupling noise prevention device that performs the method of FIG. 8.

FIG. 9 is a block diagram illustrating a coupling noise prevention device to performs the method of FIG. 8.

Referring to FIG. 9, the coupling noise prevention device 400 may include a check unit 420, a delay unit 440, a first stretch unit 460, a pass unit 470, a second stretch unit 480, and a control unit 490. The description of the check unit 420, the delay unit 440, the first stretch unit 460, the pass unit 470, and the second stretch unit 480 and their respective subcomponents will be omitted because operations of the check unit 420, the delay unit 440, the first stretch unit 460, the pass unit 470, and the second stretch unit 480 are the same as check unit 120, the delay unit 140, the first stretch unit 160, the pass unit 170, and the second stretch unit 280 which are described above with regard to FIGS. 3 and 5. Hereinafter, the control unit 490 will be described in detail.

The control unit 490 may receive a read address signal GYR and a write address signal GYW. The control unit 490 may compare the read address signal GYR with the write address signal GYW to generate an address comparison signal ACS. The control unit 490 may control the delay unit 440, the first stretch unit 460, and the second stretch unit 480 based on the address comparison signal ACS.

The read address signal GYR may correspond to the address of the read data line transferring the read operation signal. The write address signal GYW may correspond to the address of the write data line transferring the write operation signal. In example embodiments, the delay unit 440, the first stretch unit 460, and the second stretch unit 480 may operate if the read address signal GYR is substantially the same as the write address signal GYW. In example embodiments, the delay unit 440, the first stretch unit 460, and the second stretch unit 480 may operate if a difference between the read address signal GYR and the write address signal GYW is lower than the a set value.

For example, the control unit 490 may include an address comparator 492 and an AND element 494. The control unit 490 may receive the read address signal GYR and the write address signal GYW. The control unit 490 may compare the read address signal GYR with the write address signal GYW to generate the address comparison signal ACS. In example embodiments, the address comparison signal ACS may have logical value '1' if the read address signal GYR is substantially the same as the write address signal GYW. The address comparison signal ACS may have logical value '0' if the read address signal GYR is different from the write address signal GYW.

In example embodiments, the address comparison signal ACS may have logical value '1' if the difference between the read address signal GYR and the write address signal GYW is lower than the set value. The address comparison signal ACS may have logical value '0' if the difference between the read address signal GYR and the write address signal GYW is higher than the set value.

Thus, the AND element 494 may output logical value '1' to the first flip-flop 442, the second flip-flop 462, and the third flip-flop 482 when the address comparison signal ACS has logical value '1', and the read operation signal ROS has logical value '1' (e.g., the activated period of the read operation signal ROS). On the other hand, the AND element 494 may output logical value '0' to the first flip-flop 442, the second flip-flop 462, and the third flip-flop 482 when the address comparison signal ACS has logical value '0', or the read operation signal ROS has logical value '0' (e.g., the deactivated period of the read operation signal ROS).

As described above, the write operation signal WOS may be modified (e.g., delayed or stretched) such that the rising edge and the falling edge of the write operation signal WOS outside the activated period of the read operation signal ROS. In addition, the delayed write operation signal DWOS may be modified (e.g., stretched) to place the falling edge of the delayed write operation signal DWOS outside the next activated period of the read operation signal ROS. For example, the coupling noise prevention device 400 may output one of the write operation signal WOS, the delayed write operation signal DWOS, the stretched, e.g., modified to be a longer period of time, write operation signal LWOS, and the delayed-stretched write operation signal as an output signal OUT. Thus, the coupling noises between read data lines and write data lines may be prevented or reduced if when the non-volatile semiconductor memory device performs read-while-write operations.

Figure 10:
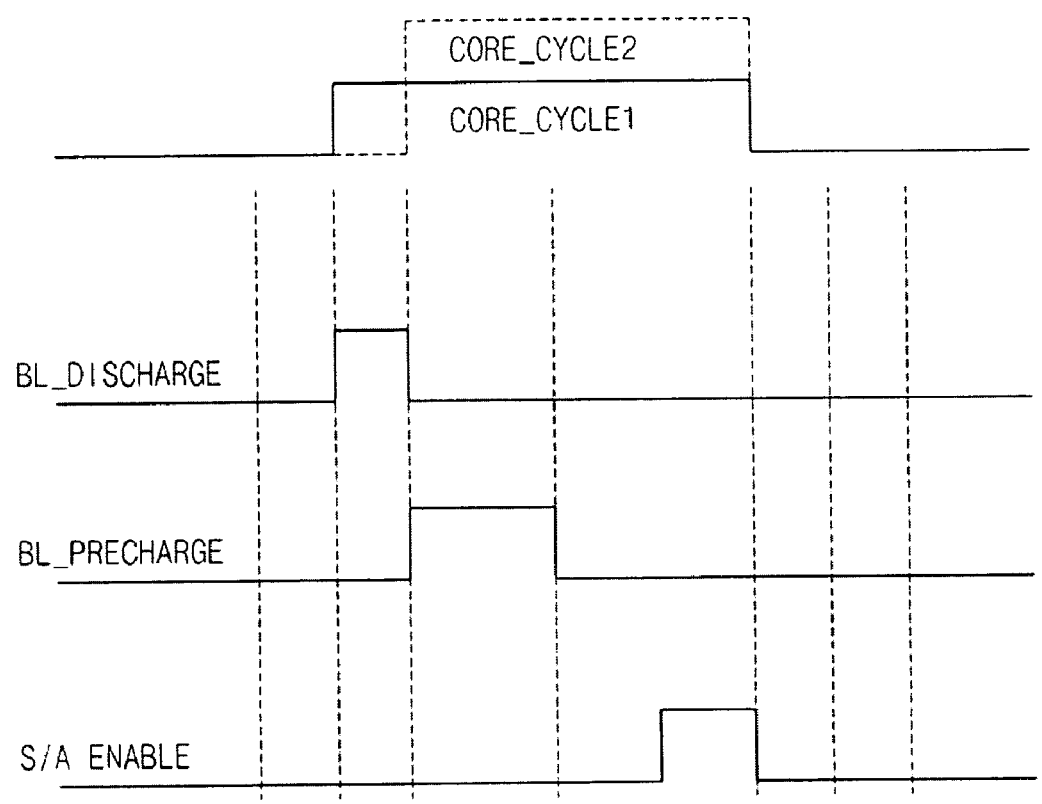
FIG. 10 is a timing diagram illustrating an example in which an activated period of a read operation signal is set by a method of preventing or reducing coupling noises for a non-volatile semiconductor memory device according to example embodiments.

FIG. 10 is a timing diagram illustrating an example embodiment in which an activated period of a read operation signal is set by a method of preventing or reducing coupling noises for a non-volatile semiconductor memory device according to example embodiments.

Referring to FIG. 10, in example embodiments, the activated period CORE_CYCLE1 of the read operation signal may be set to be from a rising edge of a bit-line discharge signal BL-DISCHARGE to a falling edge of a sensing enable signal S/A ENABLE. Thus, a write operation signal may be modified (e.g., delayed or stretched) based on a check result generated by checking if a rising edge and a falling edge of the write operation signal are overlapped within the activated period CORE_CYCLE1 of the read operation signal. In addition, a delayed write operation signal may be modified (e.g., stretched) based on a check result generated by checking if a falling edge of the delayed write operation signal is overlapped within the next activated period CORE_CYCLE1 of the read operation signal.

In another example embodiment, the activated period CORE_CYCLE2 of the read operation signal may be set to be from a rising edge of a bit-line precharge signal BL-PRECHARGE to the falling edge of the sensing enable signal S/A ENABLE. Thus, the write operation signal may be modified (e.g., delayed or stretched) based on a check result generated by checking if the rising edge and the falling edge of the write operation signal are overlapped within the activated period CORE_CYCLE2 of the read operation signal. In addition, the delayed write operation signal may be modified (e.g., stretched) based on a check result generated by checking if the falling edge of the delayed write operation signal is overlapped within the next activated period CORE_CYCLE2 of the read operation signal. However, the determination of the activated period of the read operation signal is not limited thereto.

Figure 11:
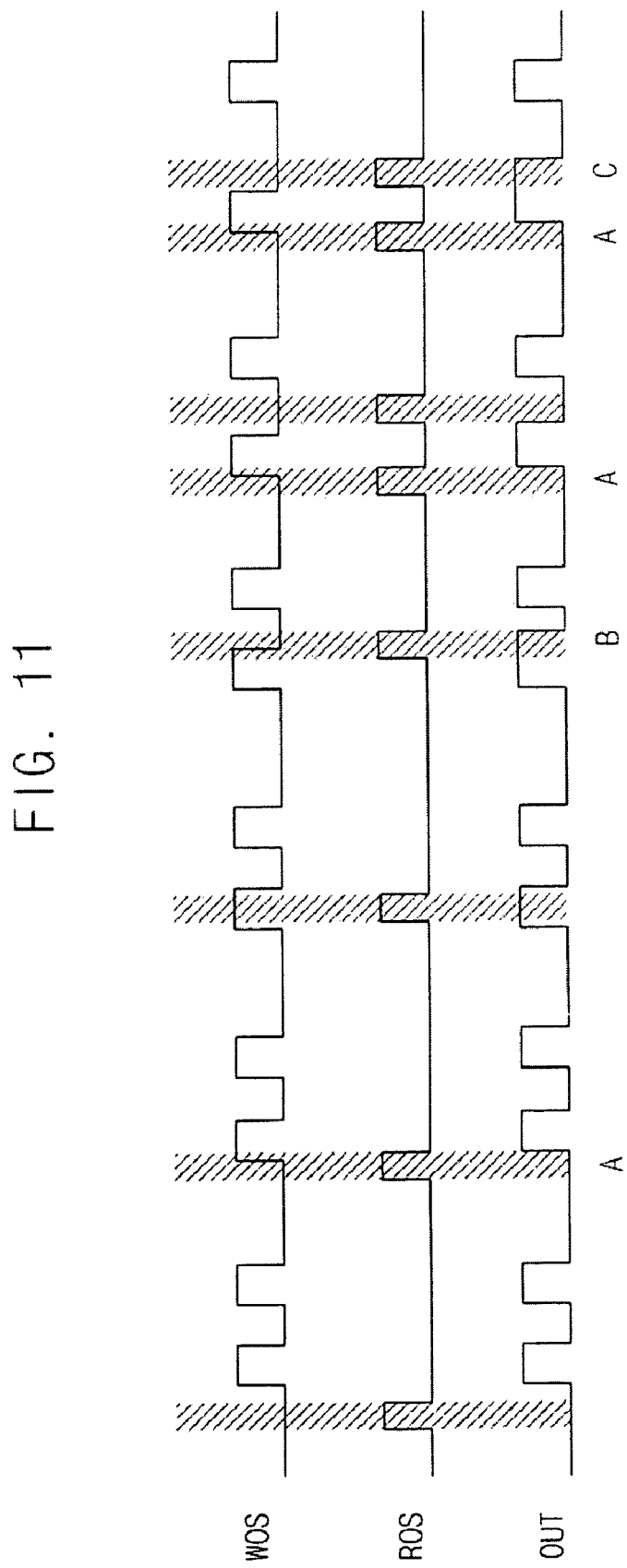
FIG. 11 is a timing diagram illustrating an example in which a write operation signal is modified by a method of preventing or reducing coupling noises for a non-volatile semiconductor memory device according to example embodiments.

FIG. 11 is a timing diagram illustrating an example embodiment in which a write operation signal is modified by a method of preventing or reducing coupling noises for a non-volatile semiconductor memory device according to example embodiments.

Referring to FIG. 11, a rising edge of the write operation signal WOS may be overlapped within an activated period of the read operation signal ROS in a first region A, such that the write operation signal WOS may be delayed by a first time period in the first region A. Thus, a delayed write operation signal may be outputted as an output signal OUT. The first time period may set the rising edge of the write operation signal WOS outside the activated period of the read operation signal ROS. In example embodiments, the first time period may set the rising edge of the write operation signal WOS after an end point of the activated period of the read operation signal ROS. As illustrated in FIG. 11, the first time period may be set to be from the rising edge of the write operation signal WOS to the end point of the activated period of the read operation signal ROS.

In addition, a falling edge of the write operation signal WOS may be overlapped within the activated period of the read operation signal ROS in a second region B, such that the write operation signal WOS may be stretched, e.g., modified to be a longer period of time, by a second time period in the second region B. Thus, a stretched, e.g., modified to be a longer period of time, write operation signal may be output as the output signal OUT. The second time period may set the falling edge of the write operation signal WOS outside the activated period of the read operation signal ROS. In example embodiments, the second time period may set the falling edge of the write operation signal WOS after the end point of the activated period of the read operation signal ROS. As illustrated in FIG. 11, the second time period may be set to be from the falling edge of the write operation signal WOS to the end point of the activated period of the read operation signal ROS.

Further, a falling edge of a delayed write operation signal generated by delaying the write operation signal WOS in the first region A may be overlapped within the activated region of the read operation signal ROS in a third region C, such that the delayed write operation signal may be stretched, e.g., modified to be a longer period of time, by a third time period. Thus, a delayed-stretched write operation signal may be output as the output signal OUT. The third time period may set the falling edge of the delayed write operation signal outside a next activated period of the read operation signal ROS.

In example embodiments, the third time period may set the falling edge of the delayed write operation signal after an end point of the next activated period of the read operation signal ROS. As illustrated in FIG. 11, the third time period is set to be from the falling edge of the delayed write operation signal to the end point of the next activated period of the read operation signal ROS.

Figure 12:
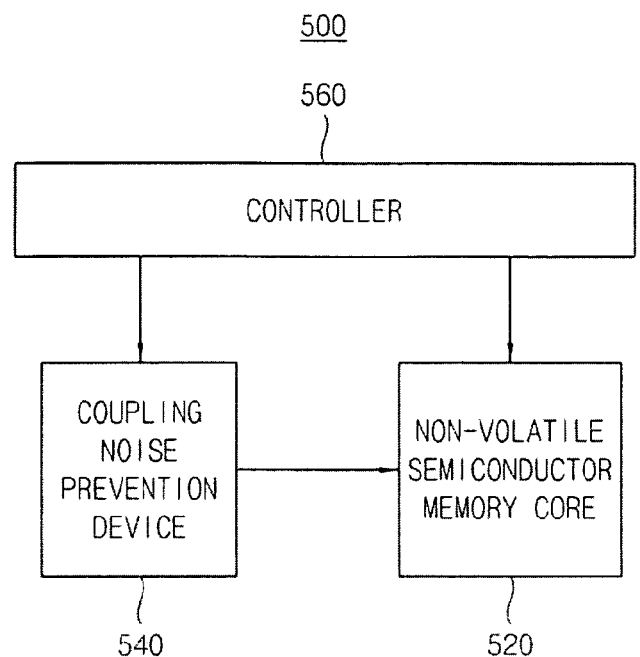
FIG. 12 is a block diagram illustrating a non-volatile semiconductor memory device including a coupling noise prevention device according to example embodiments.

FIG. 12 is a block diagram illustrating a non-volatile semiconductor memory device including a coupling noise prevention device according to example embodiments.

Referring to FIG. 12, the non-volatile semiconductor memory device 500 may include a non-volatile semiconductor memory core 520, a coupling noise prevention device 540, and a controller 560.

The non-volatile semiconductor memory core 520 may include a memory cell array and peripheral circuits. The coupling noise prevention device 540 may include a check unit, a delay unit, a first stretch unit, a pass unit, a second stretch unit, and/or a control unit. Thus, the coupling noise prevention device 540 may prevent coupling noises between read data lines and write data lines when the non-volatile semiconductor memory device 500 performs read-while-write operations. The controller 560 may control the non-volatile semiconductor memory core 520 and the coupling noise prevention device 540. As a result, the non-volatile semiconductor memory device 500 can achieve high operation reliability and high operation stability by preventing malfunctions due to the coupling noises.

Figure 13:
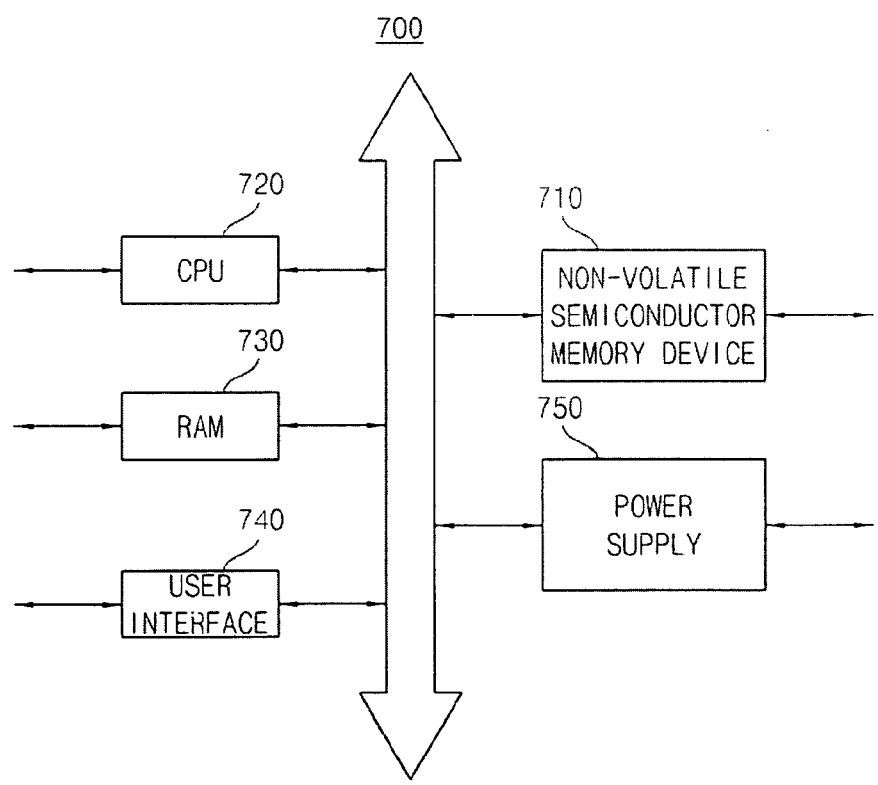
FIG. 13 is a block diagram illustrating an electric device including a non-volatile semiconductor memory device according to example embodiments.

FIG. 13 is a block diagram illustrating an device including a non-volatile semiconductor memory device according to example embodiments.

Referring to FIG. 13, the device 700 may include a non-volatile semiconductor memory device 710, a central processing unit (CPU) 720, a random access memory (RAM) 730, a user interface 740, and a power supply 750. Further, the non-volatile semiconductor memory device 710 may include a non-volatile semiconductor memory core, a coupling noise prevention device, and a controller.

The coupling noise prevention device may prevent or reduce coupling noises between read data lines and write data lines if the non-volatile semiconductor memory device 710 performs read-while-write operations. As illustrated in FIG. 13, in the device 700, the non-volatile semiconductor memory device 710 may be coupled to the CPU 720, the RAM 730, the user interface 740, and the power supply 750 via a bus. Thus, the non-volatile semiconductor memory device 710, the CPU 720, the RAM 730, the user interface 740, and the power supply 750 may interact with each other. The electric device 700 may achieve high operation reliability and high operation stability because the electric device 700 includes the non-volatile semiconductor memory device 710 in which the coupling noises are prevented or reduced during the read-while-write operations by the coupling noise prevention device.

As described above, coupling noises caused between read data lines and write data lines may be prevented or reduced by a method of the described example embodiments of the inventive concepts when a non-volatile semiconductor memory device performs read-while-write operations. Therefore, the non-volatile semiconductor memory device may achieve sufficient sensing margins for read operations. Therefore, example embodiments of the inventive concepts may be applied to a non-volatile semiconductor memory device, e.g., a phase-change random access memory device (PRAM), a flash memory device, a magnetic random access memory device (MRAM), a resistive random access memory device (RRAM), etc. Further, the non-volatile semiconductor memory device may be applied to an electric device such as a MP3 player, a cellular phone, a personal digital assistant (PDA), a portable multimedia player (PMP), a laptop, a computer, etc.

The foregoing is illustrative of example embodiments and is not to be construed as limiting thereof. Although example embodiments have been described, those skilled in the art will readily appreciate that many modifications are possible in the example embodiments without materially departing from the novel teachings and advantages of example embodiments of the inventive concepts. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of preventing coupling noises for a non-volatile semiconductor memory device, comprising:
   checking if an edge of a write operation signal is overlapped within an activated period of a read operation signal to generate a check result; and
   modifying the write operation signal based on the check result.

2. The method of claim 1, wherein the activated period of the read operation signal is from a rising edge of a bit-line discharge signal to a falling edge of a sensing enable signal.

3. The method of claim 1, wherein the activated period of the read operation signal is from a rising edge of a bit-line precharge signal to a falling edge of a sensing enable signal.

4. The method of claim 1, wherein the edge of the write operation signal is a rising edge of the write operation signal.

5. The method of claim 4, wherein modifying the write operation signal comprises:
   delaying the write operation signal by a first time period if the rising edge of the write operation signal overlaps the activated period of the read operation signal.

6. The method of claim 5, wherein the first time period shifts the rising edge of the write operation signal after an end point of the activated period of the read operation signal.

7. The method of claim 6, wherein the first time period is from the rising edge of the write operation signal to the end point of the activated period of the read operation signal.

8. The method of claim 5, wherein modifying the write operation signal further comprises:
   stretching a delayed write operation signal by a third time period if a falling edge of the delayed write operation signal overlaps a next activated period of the read operation signal.

9. The method of claim 8, wherein the third time period shifts the falling edge of the delayed write operation signal after an end point of the next activated period of the read operation signal.

10. The method of claim 9, wherein the third time period is from the falling edge of the delayed write operation signal to the end point of the next activated period of the read operation signal.

11. The method of claim 1, wherein the edge of the write operation signal is a falling edge of the write operation signal.

12. The method of claim 11, wherein modifying the write operation signal comprises:
   stretching the write operation signal by a second time period if the falling edge of the write operation signal overlaps the activated period of the read operation signal.

13. The method of claim 12, wherein the second time period shifts the falling edge of the write operation signal after an end point of the activated period of the read operation signal.

14. The method of claim 13, wherein the second time period is from the falling edge of the write operation signal to the end point of the activated period of the read operation signal.

15. The method of claim 1, wherein the write operation signal is modified if a read data line transferring the read operation signal is adjacent to a write data line transferring the write operation signal.

16. The method of claim 15, wherein the read data line is determined to be adjacent to the write data line based on an address of the read data line and an address of the write data line.

17. The method of claim 15, wherein the read data line is determined to be adjacent to the write data line when a difference between an address of the read data line and an address of the write data line is lower than a set value.

18. A method, comprising:
   detecting an edge of a write operation signal;
   detecting a period of a read operation signal;
   determining if the edge of the write operation signal overlaps the read operation signal; and
   modifying the write operation signal if the edge of the write operation signal overlaps the read operation signal.

19. The method of claim 18, wherein the modifying step comprises:
   delaying the write operation signal by a first time period if the edge of the write operation signal is a rising edge; and
   stretching the write operation signal by a second time period if the edge of the write operation signal is a falling edge.

20. The method of claim 19, wherein the delaying step comprises:
   stretching the delayed write operation signal by a third time period if a falling edge of the delayed write operation signal overlaps a next activated period of the read operation signal.

* * * * *